United States Patent [19]

White et al.

[11] Patent Number: 5,349,620

[45] Date of Patent: Sep. 20, 1994

[54] TIMER ACCESS CONTROL APPARATUS

[75] Inventors: Theodore C. White, Tustin; Jayesh V. Sheth, Mission Viejo; Kha Nguyen, Anaheim, all of Calif.

[73] Assignee: Unisys Corporation, Blue Bell, Pa.

[21] Appl. No.: 3,925

[22] Filed: Jan. 12, 1993

[51] Int. Cl.$^5$ ............................................. H03K 21/40
[52] U.S. Cl. ............................................. 377/3; 377/20; 377/28; 395/575
[58] Field of Search ................ 377/20, 28, 3; 395/575

[56] References Cited

U.S. PATENT DOCUMENTS

| | | | |
|---|---|---|---|
| 4,128,892 | 12/1978 | Vasa | 377/20 |
| 4,254,327 | 3/1981 | Beno et al. | 377/28 |
| 4,881,248 | 11/1989 | Korechika | 377/28 |

Primary Examiner—John S. Heyman
Attorney, Agent, or Firm—J. Ronald Richebourg; Mark T. Starr; Stanton D. Weinstein

[57] ABSTRACT

An apparatus is disclosed that provides control of access to a module. In particular, the module should not be accessed while in a busy or unstable state. The module disclosed herein, by way of example, is a timer module. Access to the timer is controlled by the disclosed apparatus while the timer is changing state.

8 Claims, 4 Drawing Sheets

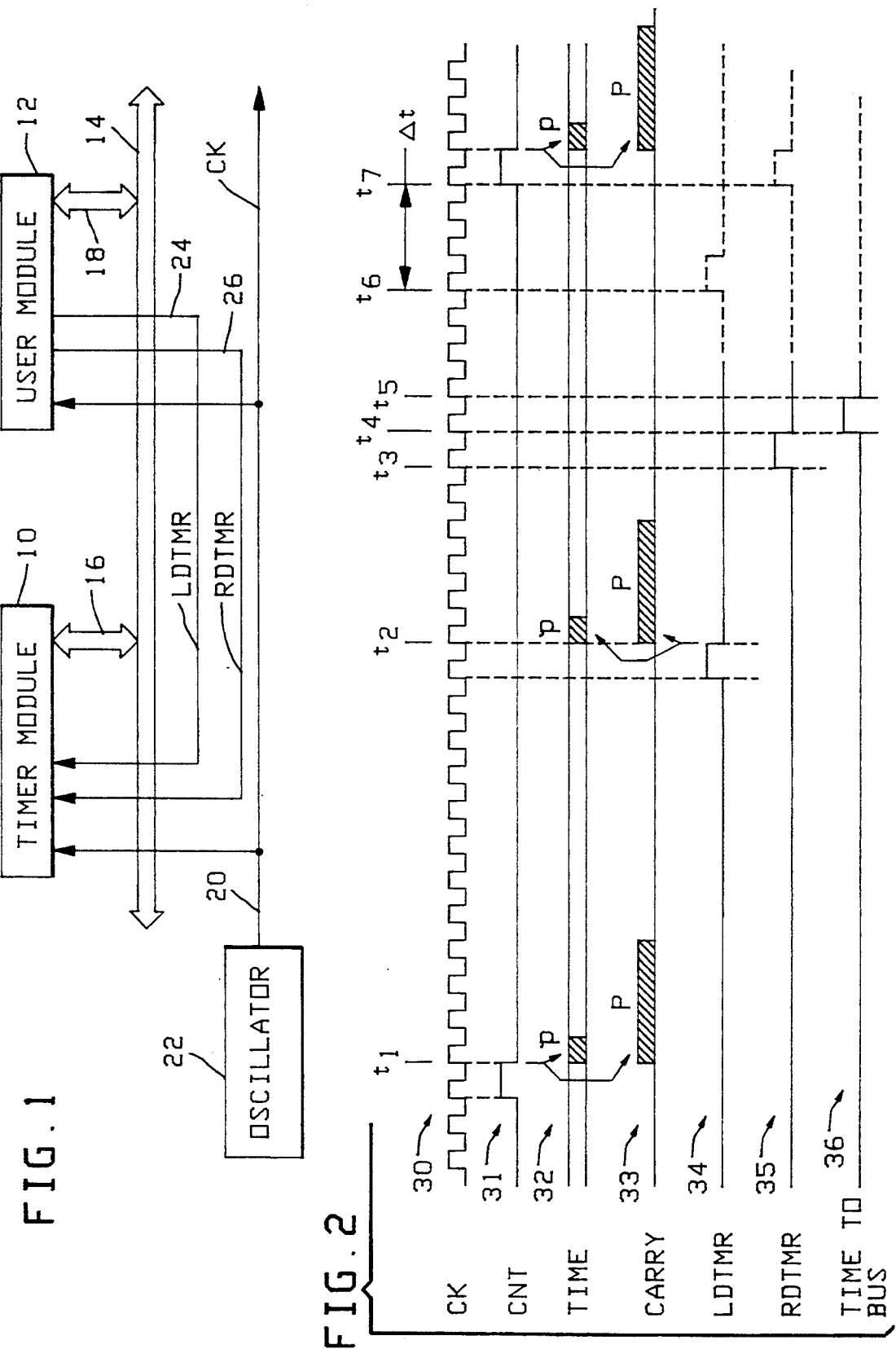

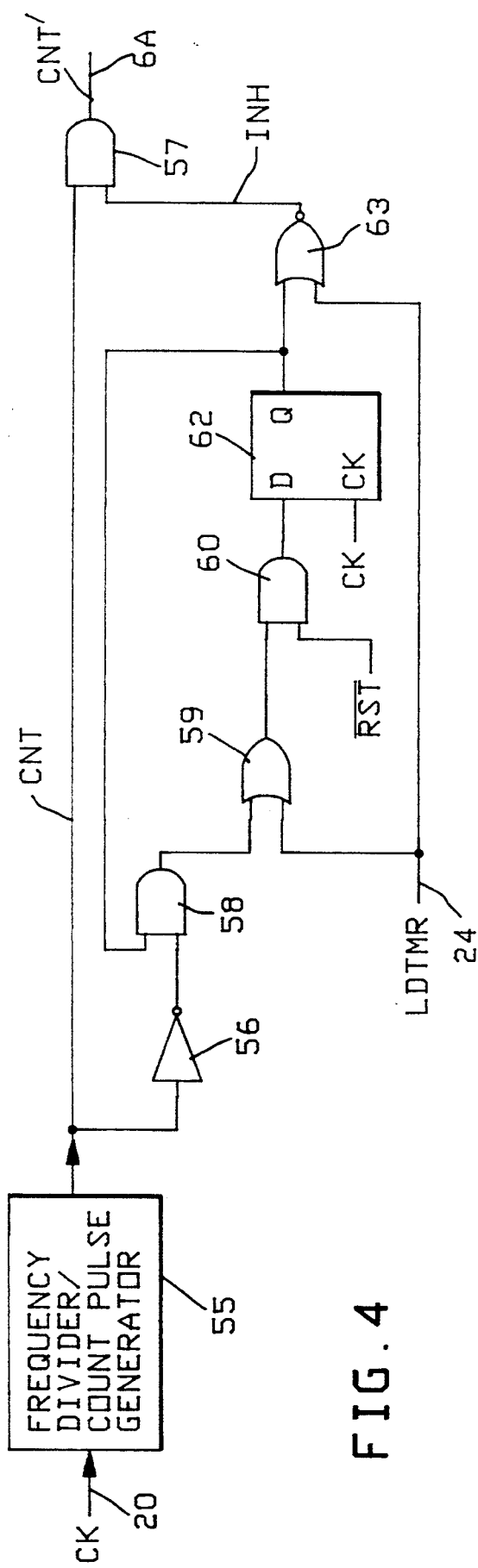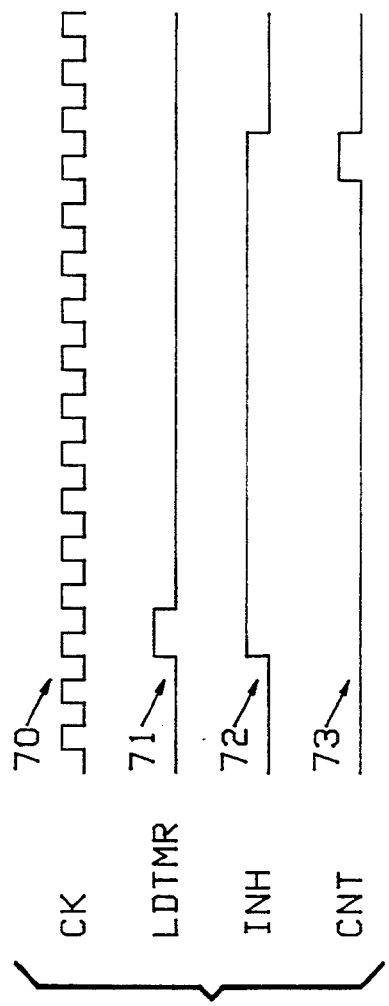

TIMER ACCESS CONTROL APPARATUS

BACKGROUND OF THE INVENTION

The present invention generally relates to digital circuitry, and more particularly to an apparatus for controlling access to a digital timer circuit.

In the field of digital computers and devices, a day and date timer circuit is often disposed for providing a time reference, either for the operator or for execution of programs. From time to time it may be necessary to reset the timer or to provide a read-out of the contents thereof, on a bus for example. The timer circuit disclosed herein is fabricated in a conventional manner by a concatenation of flip-flop circuits, whereby the output of one flip-flop is coupled to the input of the next flip-flop, et seq. Also, the output of each of the flip-flops forms a pars of the output of the timer circuit. Moreover, a clock signal is provided in parallel to each of the flip-flop circuits.

To be useful in a digital computer, for example, the timer must be large enough for long counts. As a result, the timer is so large that it is impractical to synchronize carry signals to the next stage by conventional means. Hence, the timer would not function properly. For example, if the period of time to perform a carry operation is longer than the clock period, then it is obvious that the timer cannot count every clock.

It is possible for the timer to be accessed (i.e., read or loaded) on a transition of the clock signal driving the timer. Moreover, during normal operation of the timer, a brief period of instability immediately follows each incrementation of the timer. Thus, a problem may occur if the timer is read during this period of instability.

BRIEF SUMMARY OF THE INVENTION

It is therefore an object of this invention to provide a new and improved apparatus to control access to a large timer circuit.

It is another object of this invention to modify the count signal to such a timer circuit as a function of a read-timer or load-timer (i.e., access) signal.

It is yet another object of this invention to modify the timer clock signal as a function of the read-timer or load-timer signal.

Briefly stated, the present invention provides an apparatus for controlling the access to a large timer circuit. The apparatus typically comprises means for generating a first modification of the timer count signal in response to a load-timer signal, and another means for generating a second modification of the count signal in response to a read-timer signal. It is this second modification of the count signal that is provided as the actual count (i.e., increment) signal for the timer circuit. Accordingly, the timer circuit cannot be incremented during a read or load operation.

Moreover, the clock signal for the timer is modified so as to inhibit timer incrementation if there is an overlap in positive transitions of the count signal and the read timer signal. Typically, an AND gating means is provided to accept the timer count signal and the read timer signal as inputs thereto and the output of the AND gate is coupled to an input of an OR gate. A second input of the OR gate is disposed for receiving a clock signal of the timer circuit and the output of the OR gate comprises the modified clock signal. Hence, the clock signal is passed through the OR gate unchanged until a read timer signal appears. When this happens the output of the OR gate remains high (i.e., no transition) until the read timer signal goes low again.

BRIEF DESCRIPTION OF THE DRAWINGS

The present invention will become clear from the following detailed description, particularly when taken in conjunction with the appended drawings in which:

FIG. 1 is an overall block diagram of a timer module shown as a part of a digital device;

FIG. 2 is a timing diagram illustrating the problems to be solved by this invention;

FIG. 4 is a logic diagram of the circuitry disposed for generating a first modification of the timer count signal;

FIG. 5 is a timing diagram illustrating operation of the circuitry diagram shown in FIG. 4;

DETAILED DESCRIPTION OF THE INVENTION

Figure 3:
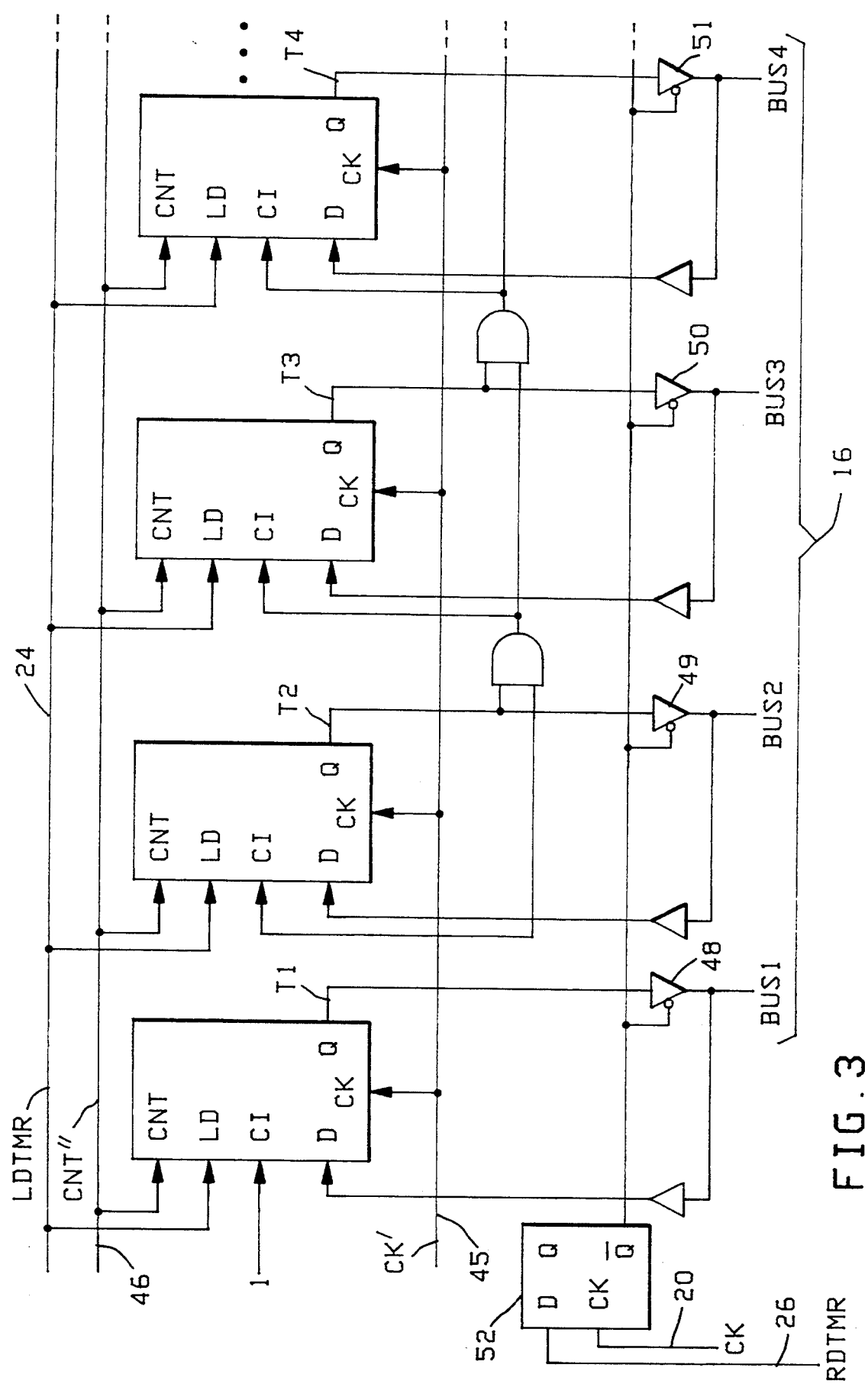
FIG. 3 is a block diagram of the timer circuit within the timer module.

Referring now to the drawings, and FIG. 1 in particular, a block diagram is shown of timer module 10 as part of a digital device including a user module 12. Each of modules 10 and 12 are coupled to a data bus 14 by means of lines 16 and 18, respectively. A device clock signal is provided on line 20, which can be generated in a conventional manner, such as by an oscillator 22. Within the user module 12 access signals are generated, such as a load-timer signal (LDTMR) and a read-timer signal (RDTMR). The LDTMR signal is transmitted to the timer module 10 over a line 24, and the RDTMR signal is likewise transmitted over a line 26.

For example, the contents of the timer circuit can be updated from the user module 12 by generating a digital number representative of the time/date and transmitting the same over the lines 18, bus 14 and lines 16; while at the same time transmitting the LDTMR signal over line 24. In a similar manner, the contents of the timer circuit can be supplied (i.e., read out) onto the bus 14 via lines 16 in response to a RDTMR signal, which is transmitted over line 26.

Referring now to FIG. 2, the operation of the timer module 10 and the problems to be solved by this invention may be more fully appreciated. Waveform 30 represents the reference clock signal (CK) supplied by the oscillator 22. Waveform 31 represents thee count signal (CNT) that is generated from the CK signal in a conventional manner in the timer module 10. Waveform. 32 represents the time (herein denoted as p) that the timer circuit is in transition in response to a normal increment (at time $t_1$) or to a LDTMR signal (e.g., waveform 34 at time $t_2$). Waveform 33 represents the time (herein denoted as P) of instability of the timer carry function during a load or count operation. Waveform 35 represents the RDTMR signal, and waveform 36 represents the time required to place the timer contents onto the bus 14.

Since either the LDTMR signal or the RDTMR signal may occur on any transition of the CK signal (waveform 30), there could be a problem if either of these access signals were to occur during the instability periods p or P. More specifically, at time $t_1$ the timer is incremented and the periods p and P of instability occur immediately thereafter. At time t₂ the same periods p and P occur again, but this time as a function of the LDTMR signal going active. At time t₃ a RDTMR signal active occurs, and between times t₄ and t₅ the contents of the timer are passed on to the bus as depicted by the waveform 36. If a CNT signal (waveform 31) were to occur shortly after a LDTMR signal (waveform 34), which is a period of instability of the timer as depicted by the period P, then an error condition will occur in the timer. For example, assume at time t₆ that the LDTMR signal goes active and at time t₇ that the CNT signal also goes active, and further assume that the time between these signals (Δt) is less than or equal to the period P of instability of the timer, then an error condition in the timer will also occur.

Prior to discussing the apparatus of this invention, which is provided to correct the potential problems alluded to above, a brief reference is made to FIG. 3. The timer circuit illustrated in FIG. 3 is of conventional construction but very large (i.e., wide). That is, a series of exemplary flip-flop circuits 40-43 are concatenated together to form a conventional digital counter. The LDTMR signal is supplied on line 24 to the LD input terminals of each of the flip-flops 40-43. It is to be understood that many more flip-flops (not shown) are required to complete the timer circuit. A modified form of the clock signal (to be explained further hereinafter, and designated CK') is supplied on line 45 to the CK input terminals of flip-flops 40-43. A modified form of the count signal (to be explained further hereinafter, and designated CNT") is supplied on line 46 to the CNT input terminals of the flip-flops 40-43.

The output terminals of the flip-flops are connected to the carry input (CI) terminals of the next higher flip-flop, and also to input terminals of gates 48-51, which are enabled to pass data therethrough as a function of the state of a latch 52. The CK signal on line 20 is coupled to the clock (CK) input terminal of the latch 52, and the RDTMR signal on the line 26 is coupled to the data (D) input terminal of latch 52. Accordingly, the contents of the timer circuit are transmitted to bus 16, through gates 48-55, as a function of the state of the latch 52, which is set on the CK signal immediately following a RDTMR active high signal.

The contents of the timer circuit may be changed in response to the data word on bus 16, but only when the LDTMR signal is active or high.

Referring now to FIG. 4, a logic diagram is shown of the means for generating a first modification of the count signal. The CK signal supplied on the line 20 is coupled to the input of a frequency divider/count pulse generator circuit 55, which is of conventional design. The circuit 55 changes the time between pulses of the CK signal (waveform 30, FIG.2) to that of the CNT signal (waveform 31, FIG.2), which is 2400 nanoseconds. The CNT signal is then coupled to the inputs of an INVERTER 56 and an AND gate 57. The output of the INVERTER 56 is coupled to one of two inputs of an AND gate 58, and the output thereof is coupled to one of two inputs of an OR gate 59. The LDTMR signal on line 24 is coupled to the second input of the OR gate 59. The output of the OR gate 59 is coupled to one of two inputs of an AND gate 60, and the second input thereof is coupled to a not reset signal ($\overline{RST}$), which is supplied on a line 61 from the user module 12 (FIG. 1).

The output of the AND gate 60 is coupled to the data (D) input terminal of a latch 62, and the clock input terminal thereof is coupled to the CK signal line 20. The true output (Q) of the latch 62 is coupled to the second input of the AND gate 58, and to the first of two inputs of an INVERTER 63. The second input of the INVERTER 63 is coupled to the LDTMR signal line 24, and the output thereof is coupled to the second input of the AND gate 57. The output of the AND gate 57 is coupled to a line 64, which is disposed for supplying a modified version of the CNT signal (hereafter referred to as CNT').

The operation of the circuit of FIG. 4 will become clear following an explanation of the timing diagram shown in FIG. 5, wherein waveform 70 represents the CK signal supplied on the line 20. Waveform 71 represents the LDTMR signal supplied on the line 24 and waveform 72 represents a signal referred to herein as inhibit (INH), which is the output of the INVERTER 63 (FIG. 4). The time in which waveform 72 is high (i.e., positive) is adequate time for the carry signal (waveform 33, FIG. 2) to stabilize. Hence, the first CNT pulse after the LDTMR signal is ignored. Waveform 73 represents the CNT signal supplied at the output of the circuit 55. The circuit shown in FIG. 4 is essentially a latch that is set by the LDTMR signal and reset by the next following CNT signal. The duration of the INH signal appearing at the output of the NOR gate 63 ensures adequate time for the timer circuit to stabilize prior to the next CNT signal and this time is equal to the time between the LDTMR signal going active and the very next positive transition of the CNT signal. Hence, throw away the next CNT signal after the LDTMR signal goes active, thereby avoiding the problem. This does not cause any meaningful error in the timer circuit since it would only be off by two millionths of a second, which is substantially less than any error in the oscillator 22.

Figure 6:
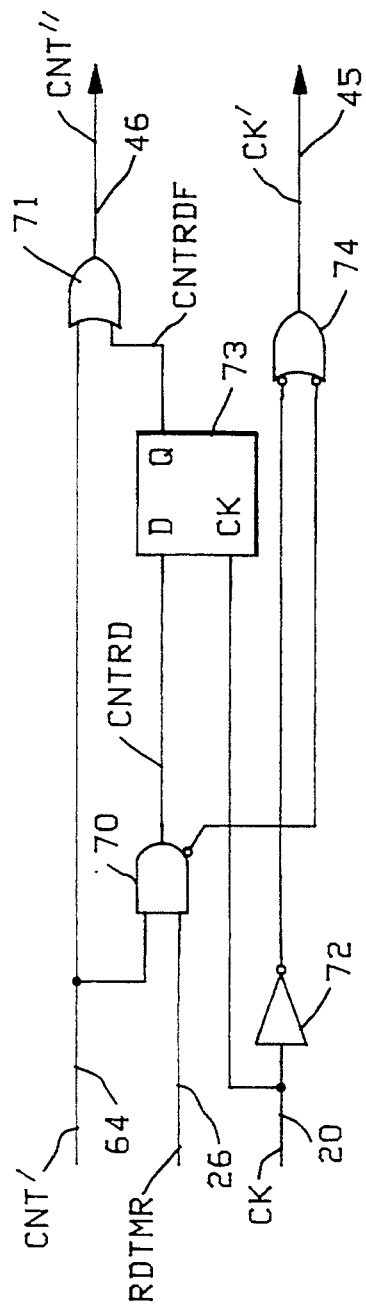
FIG. 6 is a logic diagram of the circuitry disposed for generating a second modification of the timer count signal; and, FIG. 7 is a timing diagram illustrating operation of the circuitry shown in FIG. 6.

Referring now to FIG. 6, a logic diagram is shown of the means for generating the second modification of the timer count signal (hereafter CNT"). The output of the AND gate 57 (FIG. 4) is coupled to the first of two input terminals of each of an AND gate 70 and an OR gate 71. The output of the OR gate 71 is coupled to the line 46, which transmits the CNT" signal to the timer circuit (FIG. 3). The line 26, which transmits the RDTMR signal, is coupled to the second input of the AND gate 70. The line 20, which transmits the CK signal, is coupled to the input of an inverter 72 and to the clock (CK) input of a latch 73. The output of the AND gate 70 is coupled to the data (D) input of the latch 73, and the true (Q) output of the latch 73 is coupled to the second input of the OR gate 71.

The output of the INVERTER 72 is coupled to the first of two inverting input terminals of an OR gate 74. An inverted output of the AND gate 70 is coupled to the second inverting input of the OR gate 74. The output of the OR gate 74 is coupled to the line 45, which transmits the CK' signal to the timer circuit (FIG. 3). In operation, the CK signal is coupled through the OR gate 74 without modification until the RDTMR signal goes high. When this happens, the output of the OR gate 74 remains high for a complete cycle of the CK signal and when the RDTMR signal goes low again the CK signal passes through the OR gate 74 without modification.

Figure 7:
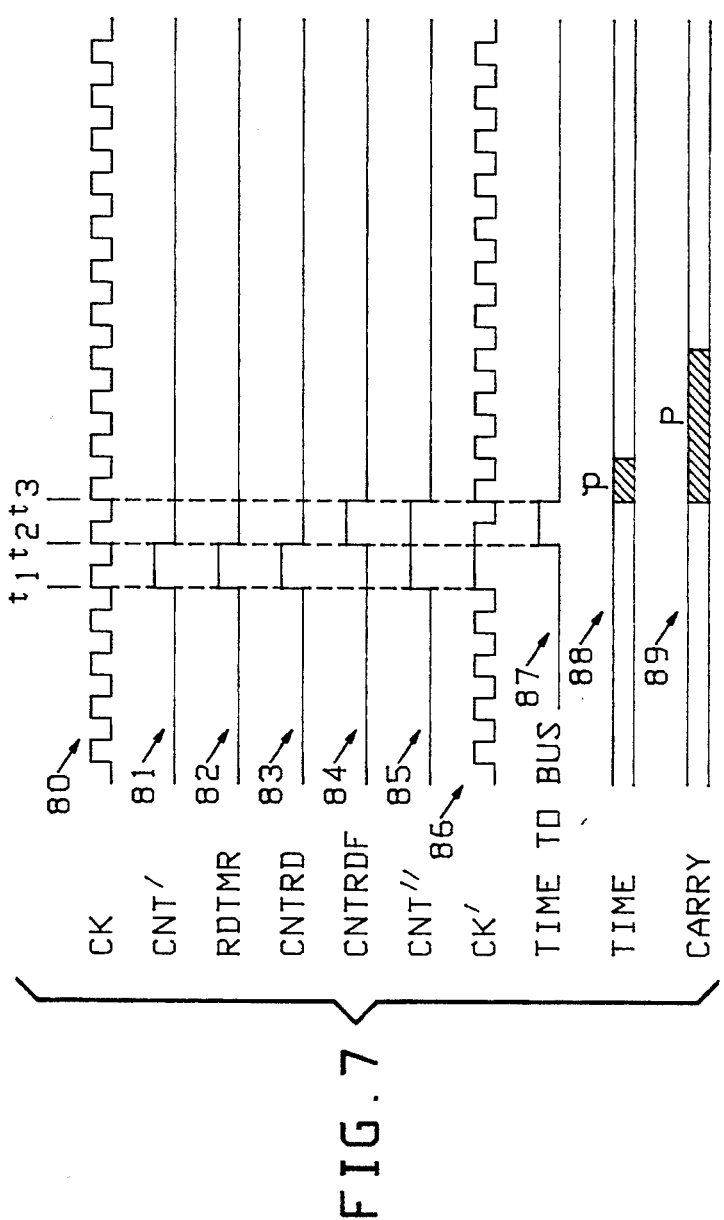

The operation of the logic in FIG. 6 will become clear with reference to the timing diagram shown in FIG. 7, wherein waveform 80 represent the clock (CK) signal. Waveform 81 represents the CNT' signal appearing on line 64 at the inputs of the gates 70 and 71 (FIG. 6), and waveform 82 represents the RDTMR signal. The output of the AND gate 70, which is denoted herein as the CNTRD signal, is represented by the waveform 83. The true output (Q) of the latch 73, which is denoted herein as the CNTRDF signal, is represented by the waveform 84. The output of the OR gate 71, which constitutes the CNT" signal, is represented by the waveform 85. Note that the CNT" signal spans two full cycles of the clock signal, as indicated between times $t_1$ and $t_3$.

Waveform 86 represents the modified clock signal (CK'). Note that at time $t_2$ the CK' signal remains high, i.e., without transition, which is effected by the RDTMR signal being high on the line 26 and the AND gate 70. After the RDTMR signal goes low again, the CK' signal on the line 45 looks like the CK signal on the line 20. The effect of this modification of the clock signal is that the timer circuit is updated one clock cycle after the RDTMR signal is active (i.e., high).

Waveform 87 represents the time to provide the contents of the timer circuit to the bus 16. Waveform 88 represents the instability period p for the timer circuit to change state, and waveform 89 represents the instability period P during a carry operation.

It should be noted that the circuits in FIGS. 4 and 6 are coupled in series with one another. This is done so as to correct either of the above-described problems.

Though the present invention has been described in detail with reference to a specific embodiment, it is understood that various changes and modifications may be made in the above-described apparatus and method without departing from the spirit or scope of the present invention. It is, therefore, intended that the invention described herein be limited only by the appended claims.

What is claimed is:

1. An apparatus for controlling access to a timer circuit during periods of instability thereof, said apparatus comprising:
   a.) first terminal means disposed for receiving a count signal of said timer circuit;
   b.) second terminal means disposed for receiving a clock signal of said timer circuit;
   c.) third terminal means disposed for receiving a load-timer signal;
   d.) fourth terminal means disposed for receiving a read-timer signal;
   e.) means for generating a first modification of said count signal, including logic means for generating an inhibit signal in response to a positive transition of said load-timer signal and a positive transition of said count signal, and gating means for combining said inhibit signal and said count signal such that said first modified count signal is inactive during the presence of said inhibit signal; and,
   f.) means for generating a second modification of said count signal in response to said read-timer signal said clock signal and said first modified count signal, said second modification of said count signal being supplied for incrementing said timer circuit, whereby said timer circuit cannot be incremented during a read or load operation.

2. An apparatus in accordance with claim 1 wherein said means for generating a first modification of said count signal includes:
   a. latch means for storing a positive transition of said load-timer signal and restoring on a positive transition of said count signal;
   b. first gating means for generating an inhibit signal in response to the state of said latch means and said load timer signal; and,
   c. second gating means for combining said inhibit signal and said count signal, whereby said first modified count signal is the output of said second gating means.

3. An apparatus in accordance with claim 1 wherein said means for generating a second modification of said count signal includes logic means for extending the period of said count signal by one cycle in response to said read-timer signal.

4. An apparatus in accordance with claim 3 wherein said logic means includes a latch means for storing overlapping positive transitions of said count signal and said read-timer signal, said latch means being reset by the absence of said read-timer signal.

5. An apparatus in accordance with claim 1 further including means for modifying said clock signal in response to said first modification of said count signal and said read-timer signal.

6. An apparatus in accordance with claim 5 wherein said means for modifying includes AND gating means responsive to said modified count signal and said read-timer signal; and,
   OR gating means responsive to said AND gating means and said clock signal, such that said clock signal is modified by deleting one transition thereof in response to said read timer signal.

7. An apparatus for controlling access to a timer circuit during periods of instability thereof, said apparatus comprising:
   a.) first terminal means disposed for receiving a count signal of said timer circuit;
   b.) second terminal means disposed for receiving a clock signal of said timer circuit;
   c.) third terminal means disposed for receiving a load-timer signal;
   d.) fourth terminal means disposed for receiving a read-timer signal;
   e.) logic means for generating a logic signal in response to a positive transition of said load-timer signal and a positive transition of said count signal and gating means for combining said inhibit signal and said count signal such that said first modified count signal is inactive during the presence of said inhibit signal;
   f.) logic means for extending the period of said count signal one cycle in response to said read-timer signal, whereby said timer circuit cannot be incremented during a read or load operation, said logic means including a latch means for storing overlapping positive transitions of said count signal and said read-timer signal, said latch means being reset by the absence of said read-timer signal; and,
   g.) means for modifying said clock signal in response to said first modification of said count signal and said read-timer signal, including AND gating means responsive to said modified count signal and said read-timer signal and OR gating means responsive to said AND gating means and said clock signal, such that said clock signal is modified by deleting one transition thereof in response to said read-timer signal.

8. An apparatus in accordance with claim 8 wherein said means for modifying includes AND gating means responsive to said modified count signal and said read-timer signal, and OR gating means responsive to said AND gating means and said clock signal, such that said clock signal is modified by deleting one transition thereof in response to said read timer signal.

* * * * *